US011288073B2

(12) United States Patent
Berkley et al.

(10) Patent No.: US 11,288,073 B2
(45) Date of Patent: Mar. 29, 2022

(54) SYSTEMS AND METHODS FOR CALIBRATING DEVICES USING DIRECTED ACYCLIC GRAPHS

(71) Applicant: D-WAVE SYSTEMS INC., Burnaby (CA)

(72) Inventors: Andrew J. Berkley, Vancouver (CA); Ilya V. Perminov, Vancouver (CA); Mark W. Johnson, Vancouver (CA); Christopher B. Rich, Vancouver (CA); Fabio Altomare, North Vancouver (CA); Trevor M. Lanting, Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 87 days.

(21) Appl. No.: 16/854,396

(22) Filed: Apr. 21, 2020

(65) Prior Publication Data

US 2020/0379768 A1 Dec. 3, 2020

Related U.S. Application Data

(60) Provisional application No. 62/842,933, filed on May 3, 2019.

(51) Int. Cl.
*G06F 15/76* (2006.01)
*G06F 9/38* (2018.01)
(Continued)

(52) U.S. Cl.
CPC ........ *G06F 9/3838* (2013.01); *G06F 16/9024* (2019.01); *G06N 10/00* (2019.01); *H01L 39/223* (2013.01)

(58) Field of Classification Search
CPC ... G06F 9/3838; G06F 16/9024; G06N 10/00; H01L 39/223
See application file for complete search history.

(56) References Cited

U.S. PATENT DOCUMENTS 6,373,294 B1 4/2002 Bentley
6,911,664 B2 6/2005 Il et al.
(Continued)

FOREIGN PATENT DOCUMENTS

WO 2012064974 A2 5/2012
WO 2014123980 A1 8/2014
(Continued)

OTHER PUBLICATIONS

Amin et al., "First Order Quantum Phase Transition in Adiabatic Quantum Computation", arXiv:0904.1387v3, Dec. 15, 2009, 5 pages.
(Continued)

*Primary Examiner* — Cheng Yuan Tseng
(74) *Attorney, Agent, or Firm* — Cozen O'Connor (57) ABSTRACT

A hybrid processor includes a classical (digital) processor and a quantum processor and implements a calibration procedure to calibrate devices in the quantum processor. Parameter measurements are defined as vertices in a directed acyclic graph. Dependencies between measurements are defined as directed edges between vertices. The calibration procedure orders the vertices, respecting the order of the dependencies while at least attempting to reduce the time needed to perform all the measurements. The calibration procedure provides a level of abstraction to allow non-expert users to use the calibration procedure. Each vertex has a set of attributes defining the status of the measurement, time of the measurement and value of the measurement.

26 Claims, 6 Drawing Sheets

(51) Int. Cl.
  *G06N 10/00* (2022.01)
  *G06F 16/901* (2019.01)
  *H01L 39/22* (2006.01)

(56) References Cited

U.S. PATENT DOCUMENTS

| | | | |
|---|---|---|---|
| 7,135,701 B2 | 11/2006 | Amin et al. | |
| 7,230,266 B2 | 6/2007 | Hilton et al. | |
| 7,307,275 B2 | 12/2007 | Lidar et al. | |
| 7,533,068 B2* | 5/2009 | Maassen van den Brink | G06F 15/76 706/10 |
| 7,619,437 B2 | 11/2009 | Thom et al. | |
| 7,639,035 B2 | 12/2009 | Berkley | |
| 7,843,209 B2 | 11/2010 | Berkley | |
| 7,876,248 B2 | 1/2011 | Berkley et al. | |
| 7,898,282 B2 | 3/2011 | Harris et al. | |
| 7,921,072 B2* | 4/2011 | Bohannon | G06F 16/88 707/601 |
| 7,932,907 B2* | 4/2011 | Nachmanson | G06T 11/206 345/440 |
| 7,984,012 B2* | 7/2011 | Coury | G06T 11/206 706/62 |
| 8,008,942 B2 | 8/2011 | Van et al. | |
| 8,098,179 B2 | 1/2012 | Bunyk et al. | |
| 8,169,231 B2 | 5/2012 | Berkley | |
| 8,174,305 B2 | 5/2012 | Harris | |
| 8,175,995 B2* | 5/2012 | Amin | G06N 10/00 706/45 |
| 8,190,548 B2 | 5/2012 | Choi | |
| 8,195,596 B2 | 6/2012 | Rose et al. | |
| 8,421,053 B2* | 4/2013 | Bunyk | H01L 39/025 257/9 |
| 8,429,108 B2* | 4/2013 | Eusterbrock | G06F 17/10 706/45 |
| 8,560,282 B2* | 10/2013 | Macready | B82Y 10/00 703/3 |
| 8,874,477 B2* | 10/2014 | Hoffberg | G06Q 10/103 705/37 |
| 8,972,237 B2 | 3/2015 | Wecker | |
| 9,189,217 B2* | 11/2015 | Von Platen | G06F 8/452 |
| 9,588,940 B2* | 3/2017 | Hamze | G06F 17/18 |
| 9,710,758 B2* | 7/2017 | Bunyk | G06F 15/82 |
| 10,031,887 B2* | 7/2018 | Raymond | G06N 10/00 |
| 10,650,050 B2* | 5/2020 | He | G06F 16/217 |
| 11,087,616 B2* | 8/2021 | Rom | G08G 1/0112 |
| 2002/0188578 A1 | 12/2002 | Amin et al. | |
| 2003/0102470 A1 | 6/2003 | Il et al. | |
| 2003/0169041 A1 | 9/2003 | Coury et al. | |
| 2005/0008050 A1 | 1/2005 | Fischer et al. | |
| 2007/0180586 A1 | 8/2007 | Amin | |
| 2007/0239366 A1 | 10/2007 | Hilton et al. | |
| 2008/0052055 A1 | 2/2008 | Rose et al. | |
| 2009/0192041 A1 | 7/2009 | Johansson et al. | |
| 2009/0259905 A1 | 10/2009 | Silva et al. | |
| 2009/0261319 A1 | 10/2009 | Maekawa et al. | |
| 2009/0289638 A1 | 11/2009 | Farinelli et al. | |
| 2010/0150222 A1 | 6/2010 | Meyers et al. | |
| 2011/0054876 A1 | 3/2011 | Biamonte et al. | |
| 2011/0057169 A1 | 3/2011 | Harris et al. | |
| 2011/0060780 A1 | 3/2011 | Berkley et al. | |
| 2011/0065586 A1 | 3/2011 | Maibaum et al. | |
| 2011/0138344 A1 | 6/2011 | Ahn | |
| 2012/0023053 A1 | 1/2012 | Harris et al. | |
| 2012/0087867 A1 | 4/2012 | Mccamey et al. | |
| 2012/0144159 A1 | 6/2012 | Pesetski et al. | |
| 2012/0265718 A1 | 10/2012 | Amin et al. | |
| 2013/0106476 A1 | 5/2013 | Joubert et al. | |
| 2013/0117200 A1 | 5/2013 | Thom | |
| 2013/0267032 A1 | 10/2013 | Tsai et al. | |
| 2014/0229722 A1 | 8/2014 | Harris | |
| 2015/0262073 A1 | 9/2015 | Lanting | |
| 2015/0286748 A1* | 10/2015 | Lilley | G06F 16/28 707/794 |
| 2015/0363708 A1* | 12/2015 | Amin | G06N 10/00 712/42 |
| 2016/0079968 A1 | 3/2016 | Strand et al. | |
| 2016/0233860 A1 | 8/2016 | Naaman | |
| 2016/0267032 A1 | 9/2016 | Rigetti et al. | |
| 2017/0017894 A1 | 1/2017 | Lanting et al. | |
| 2017/0104695 A1 | 4/2017 | Naaman | |
| 2017/0300817 A1* | 10/2017 | King | G06N 10/00 |
| 2017/0364362 A1 | 12/2017 | Lidar et al. | |
| 2019/0266508 A1* | 8/2019 | Bunyk | G06F 11/0751 |
| 2019/0391093 A1* | 12/2019 | Achlioptas | G16H 50/70 |
| 2020/0005155 A1* | 1/2020 | Datta | G06N 3/10 |
| 2020/0183768 A1 | 6/2020 | Berkley et al. | |
| 2020/0334563 A1* | 10/2020 | Gambetta | B82Y 10/00 |
| 2020/0349326 A1 | 11/2020 | King | |
| 2020/0379768 A1* | 12/2020 | Berkley | G06F 9/3838 |

FOREIGN PATENT DOCUMENTS

| | | |
|---|---|---|
| WO | 2016182608 A2 | 11/2016 |
| WO | 2016183213 A1 | 11/2016 |
| WO | 2018064535 A1 | 4/2018 |
| WO | 2020112185 A2 | 6/2020 |

OTHER PUBLICATIONS

Amin et al., Macroscopic Resonant Tunneling in the Presence of Low Frequency Noise, arXiv:0712.0845 [cond-mat.mes-hall], May 13, 2008, pp. 1-4.

Amin, "Effect of Local Minima on Adiabatic Quantum Optimization," Physical Review Letters 100(130503), 2008, 4 pages.

Aspuru-Guzik. "Simulated Quantum Computation of Molecular Energies", Science, Sep. 9, 2005.

Berkley, A.J. et al., "Tunneling Spectroscopy Using a Probe Qubit," arXiv:1210.6310v2 [cond-mat.supr-con], Jan. 3, 2013, 5 pages.

Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.

Byrd. "A Limited-Memory Algorithm For Bound-Contrained Optimization". SIAM Journal on Scientific Computing, Jun. 17, 2005.

Dhande et al. "End-User Calibration for Quantum Annealing". Engineering Project Report—UBC, Jan. 6, 2019.

D-Wave, "Technical Description of the D-Wave Quantum Processing Unit", D-Wave User Manual 09-1109A-M, Sep. 24, 2018, 56 pages.

Gao, Jiansong, "The Physics of Superconducting Microwave Resonators," Thesis, In Partial Fulfillment of the Requirements for the Degree of Doctor of Philosophy, California Institute of Technology Pasadena, California, May 28, 2008, 197 pages.

Harris et al., "Probing Noise in Flux Qubits via Macroscopic Resonant Tunneling", arXiv:0712.0838v2 [cond-mat.mes-hall], Feb. 8, 2008, pp. 1-4.

King et al., "Observation of topological phenomena in a programmable lattice of 1,800 qubits", arXiv:1803.02047 [quant-ph], Mar. 6, 2018, 17 pages.

Lanting et al., "Geometrical dependence of the low-frequency noise in superconducting flux qubits", Physical Review B, 79, 060509, Jun. 5, 2009, 4 pages.

Lanting et al., "Probing High Frequency Noise with Macroscopic Resonant Tunneling", arXiv:1103.1931v1 [cond-mat.supr-con], Mar. 20, 2011, 5 pages.

Lanting, T., "Observation of Co-tunneling in Pairs of Coupled Flux Qubits", arXiv:1006.0028v1 [cond-mat.supr-con], May 31, 2010, 4 pages.

Manucharyan et al., "Fluxonium: single Cooper pair circuit free of charge offsets", arXiv:0906.0831v2, [cond-mat.mes-hall] Oct. 20, 2009, 13 pages.

Nielsen. "The Fermionic canonical commutation relations and the Jordan-Wigner transform", School of Physical Sciences, Jul. 29, 2005.

Petersan et al., "Measurement of resonant frequency and quality factor of microwave resonators: Comparison of methods," Journal of Applied Physics, vol. 84, No. 6, Sep. 15, 1998, 11 pages.

(56) References Cited

OTHER PUBLICATIONS

Sete et al., "A Functional Architecture for Scalable Quantum Computing", 2016 IEEE International Conference on Rebooting Computing (ICRC), Oct. 17, 2016, 5 pages.

Swenson et al., "Operation of a titanium nitride superconducting microresonator detector in the nonlinear regime," arXiv:1305.4281v1 [cond-mat.supr-con], May 18, 2013, 11 pages.

Tolpygo et al., "Advanced Fabrication Processes for Superconducting Very Large Scale Integrated Circuits," IEEE Transactions on Applied Superconductivity 26(3):1-10, Jan. 19, 2016.

Van Harlingen et al., "Decoherence in Josephson-junction qubits due to critical current fluctuations", arXiv:cond-mat/0404307v1 [cond-mat.supr-con], Apr. 13, 2004, 24 pages.

Whittaker, J.D. et al., "A Frequency and Sensitivity Tunable Microresonator Array for High-Speed Quantum Processor Readout," arXiv:1509.05811v2 [quant-ph], Apr. 22, 2016, 8 pages.

Yohannes et al, "Planarized, Extensible, Multiplayer, Fabrication Process for Superconducting Electronics", IEEE Transactions on Applied Superconductivity, vol. 25, No. 3, Jun. 2015.

* cited by examiner

SYSTEMS AND METHODS FOR CALIBRATING DEVICES USING DIRECTED ACYCLIC GRAPHS

FIELD

This disclosure generally relates to calibration of quantum processors.

BACKGROUND

Hybrid Computing System Comprising a Quantum Processor

A hybrid computing system can include a digital computer communicatively coupled to an analog computer. In some implementations, the analog computer is a quantum computer and the digital computer is a classical computer.

The digital computer can include a digital processor that can be used to perform classical digital processing tasks described in the present systems and methods. The digital computer can include at least one system memory which can be used to store various sets of computer- or processor-readable instructions, application programs and/or data.

The quantum computer can include a quantum processor that includes programmable elements such as qubits, couplers, and other devices. The qubits can be read out via a readout system, and the results communicated to the digital computer. The qubits and the couplers can be controlled by a qubit control system and a coupler control system respectively. In some implementations, the qubit and the coupler control systems can be used to implement quantum annealing on the analog computer.

Quantum Processor

A quantum processor may take the form of a superconducting quantum processor. A superconducting quantum processor may include a number of superconducting qubits and associated local bias devices. A superconducting quantum processor may also include coupling devices (also known as couplers) that selectively provide communicative coupling between qubits.

In one implementation, the superconducting qubit includes a superconducting loop interrupted by a Josephson junction. The ratio of the inductance of the Josephson junction to the geometric inductance of the superconducting loop can be expressed as $2\pi LI_C/\Phi_0$ (where L is the geometric inductance, $I_C$ is the critical current of the Josephson junction, and $\Phi_0$ is the flux quantum). The inductance and the critical current can be selected, adjusted, or tuned, to increase the ratio of the inductance of the Josephson junction to the geometric inductance of the superconducting loop, and to cause the qubit to be operable as a bistable device. In some implementations, the ratio of the inductance of the Josephson junction to the geometric inductance of the superconducting loop of a qubit is approximately equal to three.

In one implementation, the superconducting coupler includes a superconducting loop interrupted by a Josephson junction. The inductance and the critical current can be selected, adjusted, or tuned, to decrease the ratio of the inductance of the Josephson junction to the geometric inductance of the superconducting loop, and to cause the coupler to be operable as a monostable device. In some implementations, the ratio of the inductance of the Josephson junction to the geometric inductance of the superconducting loop of a coupler is approximately equal to, or less than, one.

Further details and embodiments of exemplary quantum processors that may be used in conjunction with the present systems and devices are described in, for example, U.S. Pat. Nos. 7,533,068; 8,008,942; 8,195,596; 8,190,548; and 8,421,053.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

A method of operation of a hybrid processor is described. The hybrid processor comprises a quantum processor and a classical processor. The quantum processor has a plurality of devices, and each of the plurality of devices has at least one respective parameter such that the quantum processor has a set of parameters comprising the at least one respective parameter of each of the plurality of devices. At least one of the parameters in the set of parameters has a dependence from another one of the parameters in the set of parameters. The method comprises mapping the set of parameters as a plurality of vertices in a graph via the classical processor; mapping each of the dependencies between parameters in the set of parameters as directed edges in the graph via the classical processor; ordering the vertices of the graph via the classical processor; and measuring each parameter in the set of parameters according to the order of the vertices of the graph via the classical processor. The vertices of the graph may be ordered using one of: a topological sort, a breadth-first sort, a depth-first sort, and a best-first sort. A vertex may be mapped for each parameter whose measurement value is used to operate the quantum processor. A vertex may have a time, a status and at least one value. The time may be the time the vertex was given a status. The method may further comprise updating the graph by at least one of: changing edges, adding edges, removing edges, adding vertices, removing vertices, updating vertices. Updating vertices may include updating the time, status and the at least one value. Updating the graph may happen in response to an error. The method may further comprise interrupting measuring a selected parameter after a threshold time. Any intermediate measurement of the parameter may be saved in a memory system. Dependencies may be mapped as directed edges in the graph when at least one of: a vertex dependent on more than one other vertex, a vertex dependent on a subset of other vertices, a vertex dependent on the value of another vertex being unchanged, a vertex dependent on having measured the value of another vertex, and a vertex dependent on the time of another vertex being unchanged. The method may further comprise running a set of diagnostics on the plurality of devices via the classical processor and in response to at least one respective device parameter having a parameter value different from a previously measured parameter value, measuring the at least one respective device parameter according to the order of the vertices of the graph via the classical processor. The set of diagnostics may comprise one or more of: identifying trapped flux in couplers, identifying trapped flux in persistent current (Ip) compensators, identifying trapped flux in compound-compound Josephson junction (CCJJ) structures, identifying trapped flux in minor lobes, and identifying residual changes.

A hybrid computational system is described. The hybrid computational system comprises a quantum processor and a classical processor. The quantum processor comprises a plurality of devices, each of the plurality of devices having at least one respective parameter such that the quantum processor has a set of parameters comprising the at least one respective parameter of each of the plurality of devices, at least one of the parameters in the set of parameters having a dependence from another one of the parameters in the set of parameters. The classical processor is operable to: map the set of parameters as a plurality of vertices in a graph, map each of the dependencies between parameters in the set of parameters as directed edges in the graph, order the vertices of the graph, and measure each parameter in the set of parameters according to the order. The classical processor may be operable to order the vertices of the graph by one of: a topological sort, a breadth-first sort, a depth-first sort, and a best-first sort. The classical processor may be operable to map a vertex for each parameter needed to operate the quantum processor. Each vertex may have a time, a status and at least one value. The time may be the time a status was given to the vertex. The classical processor may be further operable to update edges, remove edges, add edges, update vertices, remove vertices, and update vertices. The classical processor may be operable to update the status, the time, and the at least one value of each vertex. The classical processor may be operable update the graph in response to an error. The classical processor may be operable to interrupt the measurement of a parameter after a threshold time. The classical processor may store any intermediate measurement of the parameter in a classical processor memory system. The dependence between parameters in the set of parameters may be defined as one of: a vertex dependent on more than one other vertex, a vertex dependent on a subset of other vertices, a vertex dependent on the value of another vertex being unchanged, a vertex dependent on having measured the value of another vertex, and a vertex dependent on the time of another vertex being unchanged.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn are not necessarily intended to convey any information regarding the actual shape of the particular elements and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Figure 1:
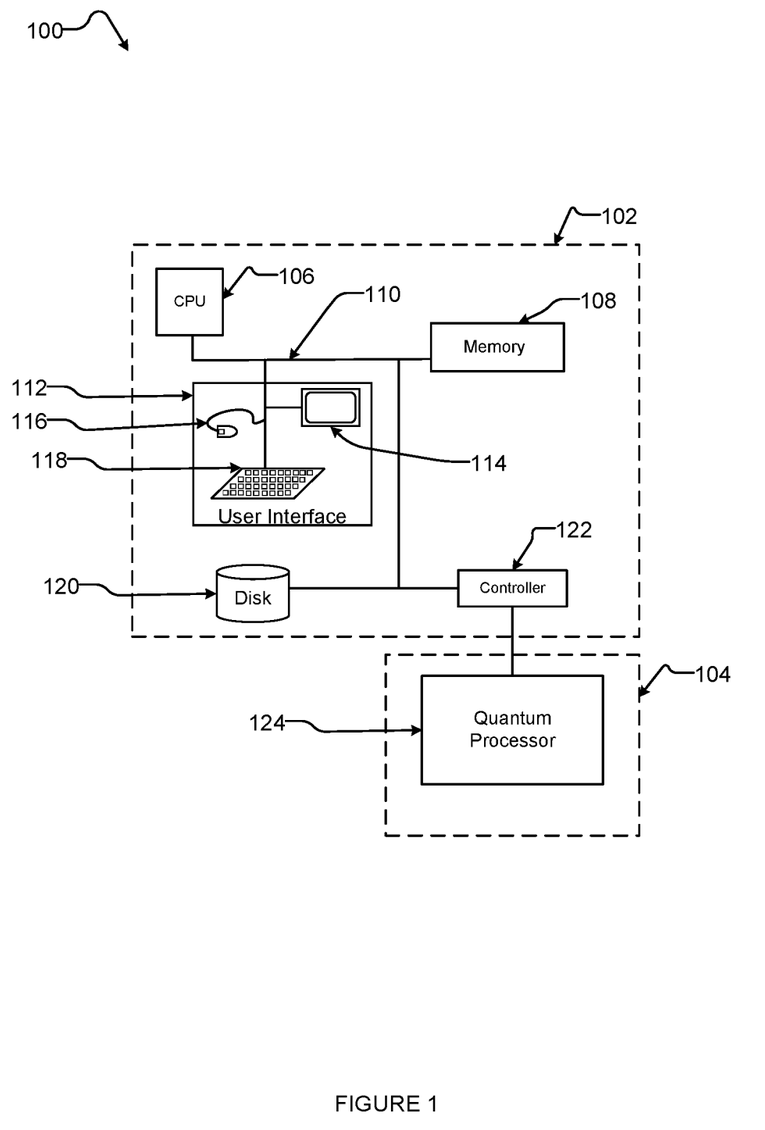
FIG. 1 is a schematic diagram of an example hybrid computing system comprising a quantum processor and a classical processor.

FIG. 1 illustrates a hybrid computing system 100 including a classical computer 102 coupled to a quantum computer 104. The example classical computer 102 includes a digital processor (CPU) 106 that may be used to perform classical digital processing tasks.

Classical computer 102 may include at least one digital processor (such as central processor unit 106 with one or more cores), at least one system memory 108, and at least one system bus 110 that couples various system components, including system memory 108 to central processor unit 106. The digital processor may be a logic processing unit, such as one or more central processing units ("CPUs"), graphics processing units ("GPUs"), digital signal processors ("DSPs"), application-specific integrated circuits ("ASICs"), programmable gate arrays ("FPGAs"), programmable logic controllers (PLCs), etc.

Classical computer 102 may include a user input/output subsystem 112. In some implementations, the user input/output subsystem includes one or more user input/output components such as a display 114, mouse 116, and/or keyboard 118.

System bus 110 can employ any known bus structures or architectures, including a memory bus with a memory controller, a peripheral bus, and a local bus. System memory 108 may include non-volatile memory, such as read-only memory ("ROM"), static random-access memory ("SRAM"), Flash NAND; and volatile memory such as random-access memory ("RAM") (not shown).

Classical computer 102 may also include other non-transitory computer or processor-readable storage media or non-volatile memory 120. Non-volatile memory 120 may take a variety of forms, including: a hard disk drive for reading from and writing to a hard disk, an optical disk drive for reading from and writing to removable optical disks, and/or a magnetic disk drive for reading from and writing to magnetic disks. The optical disk can be a CD-ROM or DVD, while the magnetic disk can be a magnetic floppy disk or diskette. Non-volatile memory 120 may communicate with the digital processor via system bus 110 and may include appropriate interfaces or controllers 122 coupled to system bus 110. Non-volatile memory 120 may serve as long-term storage for processor- or computer-readable instructions, data structures, or other data (sometimes called program modules) for classical computer 102.

Although classical computer 102 has been described as employing hard disks, optical disks and/or magnetic disks, those skilled in the relevant art will appreciate that other types of non-volatile computer-readable media may be employed, such magnetic cassettes, flash memory cards, Flash, ROMs, smart cards, etc. Those skilled in the relevant art will appreciate that some computer architectures employ volatile memory and non-volatile memory. For example, data in volatile memory can be cached to non-volatile memory, or a solid-state disk that employs integrated circuits to provide non-volatile memory.

Various processor- or computer-readable instructions, data structures, or other data can be stored in system memory 108. For example, system memory 108 may store instruction for communicating with remote clients and scheduling use of resources including resources on the classical computer 102 and quantum computer 104. For example, the system memory 108 may store processor- or computer-readable instructions, data structures, or other data which, when executed by a processor or computer causes the processor(s) or computer(s) to execute one, more than one, or all of the acts of the methods 400, 500, and 600 of FIGS. 4, 5 and 6, respectively.

In some implementations system memory 108 may store processor- or computer-readable instructions to perform pre-processing, co-processing, and post-processing by classical computer 102. System memory 108 may store a set of quantum computer interface instructions to interact with the quantum computer 104.

Quantum computer 104 may include one or more quantum processors such as quantum processor 124. Quantum computer 104 can be provided in an isolated environment, for example, in an isolated environment that shields the internal elements of the quantum computer from heat, magnetic field, and other external noise (not shown). Quantum processor 124 includes programmable elements such as qubits, couplers and other devices. In accordance with the present disclosure, a quantum processor, such as quantum processor 124, may be designed to perform quantum annealing and/or adiabatic quantum computation. Examples of quantum processors are described in U.S. Pat. No. 7,533,068.

The programmable elements of quantum processor 124, such as, for example, qubits, couplers, Digital to Analog Converters (DACs), readout elements, and other devices, need to be calibrated. A calibration may need to be performed before quantum processor 124 is operated for the first time. Additionally, it may be advantageous to perform a calibration every time there is a change in the isolated environment of quantum processor 124, for example during a regular maintenance.

It may be advantageous to perform a calibration procedure in a way that reduces calibration time, thus reducing the time a processor is not operable and reducing the amount of human intervention. Such techniques may be particularly advantageous for processors comprising a large number of devices, where a calibration procedure may be lengthy and may be the cause of a bottleneck in the operation of the quantum processor. One reason a calibration procedure can be lengthy is the presence of dependencies between the measurements to be performed, e.g., before measuring or quantifying a parameter A on a specific device, another parameter, or a set of parameters, need to be measured or quantified. Thus, a calibration procedure that can perform as many measurements as possible in parallel can save valuable time, despite the interrelation of the dependencies becoming complex in large processors.

The calibration procedure described in the present disclosure comprises building a directed acyclic graph (DAG) that defines the parameters to be measured and dependencies between them. Parameters to be measured are defined as vertices in a graph and the dependencies between the parameters as directed edges. The calibration procedure must ensure there are no cycles in the graph. After constructing the graph, the calibration procedure orders the vertices of the DAG. In some implementations, the calibration procedure orders the vertices of the DAG using a topological sort. Alternatively, the calibration procedure may order the vertices of the DAG using any of breadth-first, depth-first or best-first sort. A person skilled in the art will understand that the vertices of the DAG can be ordered by other sorting algorithms and the present description and appended claims are not limited to the above-mentioned sorting strategies. The measurements for each vertex are then performed according the order. The calibration procedure allows for as many measurements as possible to be performed in parallel, while respecting the sequence of measurements that need to be performed in a specific order. The calibration procedure may be implemented by a classical computer that is communicatively coupled to the quantum computer, as in hybrid computing system 100 of FIG. 1. The DAG may be implemented by the classical computer by one or more data structures that store the information of the DAG. Examples of data structures that can be used to represent the DAG include adjacency matrices and lists of edges. The data structures used to represent the DAG store the values of the measurements, the status of the measurements and the dependencies between measurements.

Initially, classical computer 102 defines a vertex for each parameter to be measured. The parameters to be measured are those whose results are necessary to operate the quantum processor. Some examples of parameters that need to be measured to operate a quantum processor are a flux period of a qubit, an estimate of noise on a device, measurements or quantifications characterizing crosstalk between devices, etc. Each defined vertex can have a value, resulting from a measurement or quantification, a time, and a status associated with the vertex. The time refers to the time at which the vertex was assigned a status and the status indicates the current state of the vertex.

Examples of status associated with vertices are shown in Table 1.

TABLE 1

| Status | Description |
| --- | --- |
| Unknown | The vertex has not been measured |
| Error | The vertex has been measured but an error occurred |
| Failure | The vertex measurement will never succeed |

TABLE 1-continued

| Status | Description |
| --- | --- |
| Dependency-Failure | The vertex measurement will never succeed because something it depends on failed |
| OK | The vertex has been measured successfully |

The statuses and descriptions of Table 1 are provided for examples only. A person skilled in the art will understand that above list is not comprehensive, more statuses can be added to the list and some statuses may not be used.

Some of the parameters defined as vertices may advantageously be measured and/or validated before others. For example, a readout component of the quantum processor should be determined to be operational and should be calibrated before other devices (e.g., quantum flux parametrons (QFPs)) are calibrated.

Figure 2:
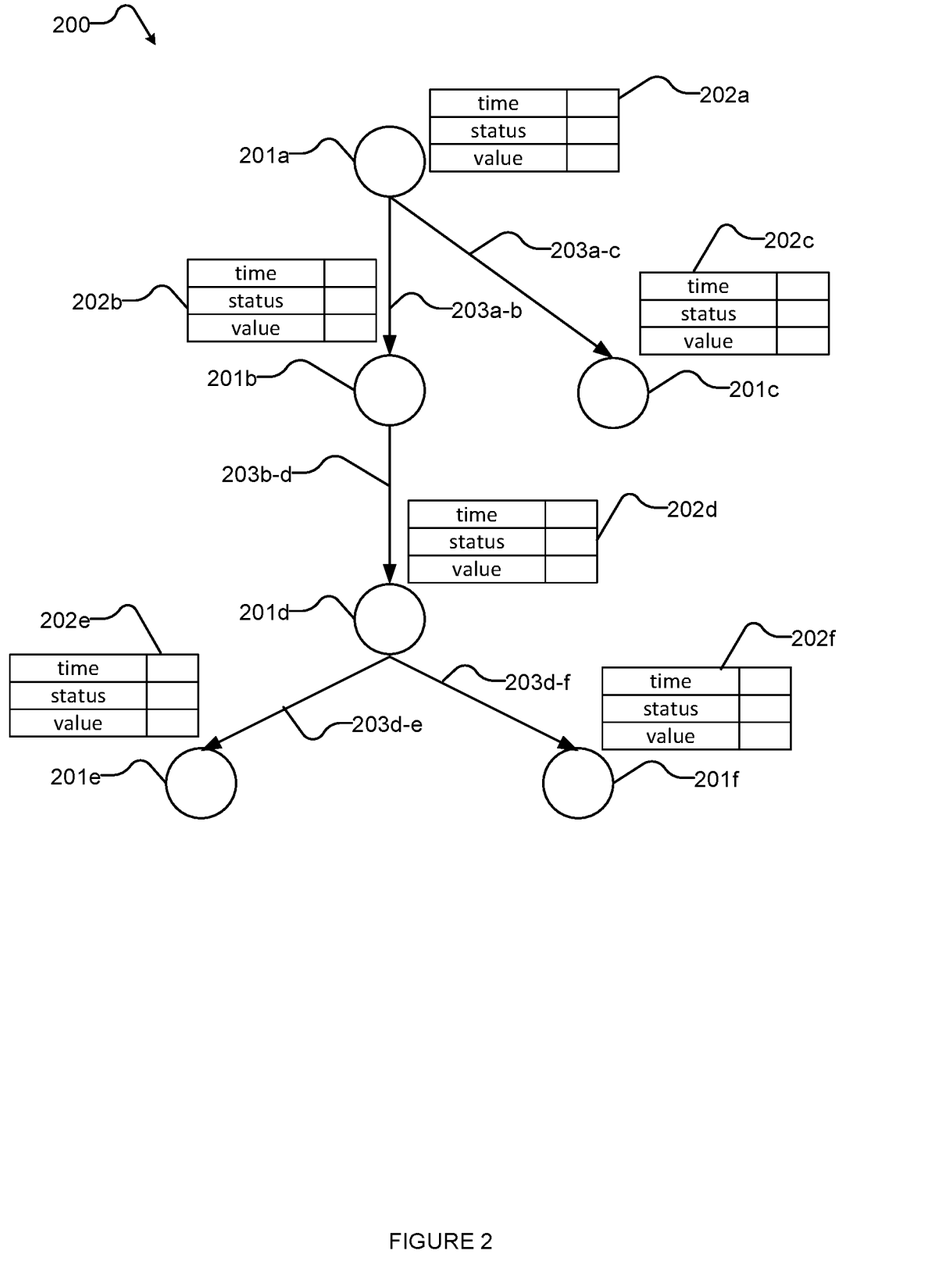
FIG. 2 is a schematic diagram of an example directed acyclic graph representing measurements and dependencies between measurements in a quantum processor.
Figure 3:
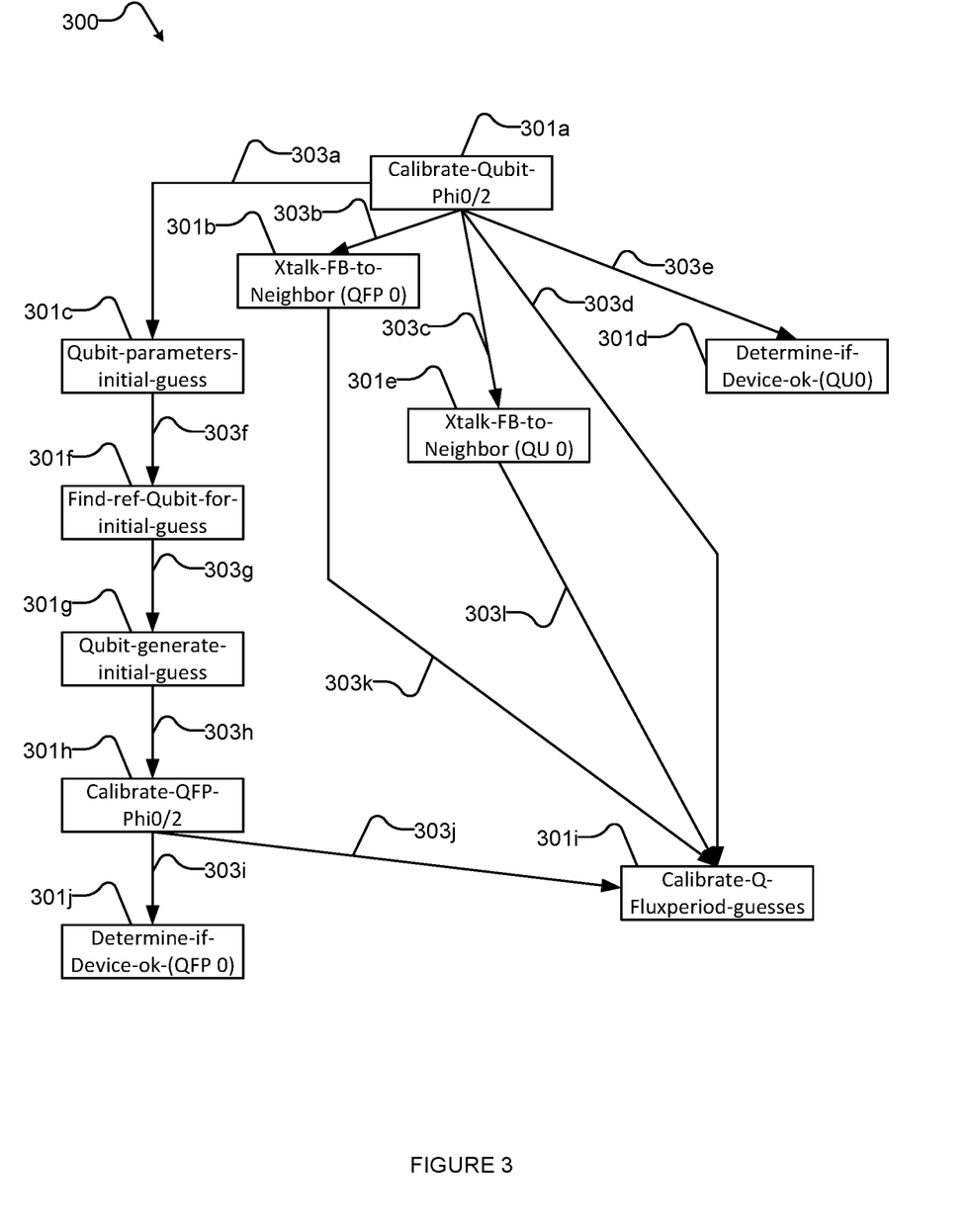
FIG. 3 is a schematic diagram of a portion of an example directed acyclic graph for calibrating a flux period of a qubit.

Subsequently, classical computer 102 defines dependencies between the vertices of the DAG as directed edges. FIGS. 2 and 3 provide specific examples of dependencies and their representation as directed edges.

There are several kinds of dependencies between vertices. Examples of dependencies are listed in Table 2.

TABLE 2

| Dependency | Description |
| --- | --- |
| No dependency | A vertex does not depend on any other vertex. |
| Lazy dependency | A vertex depends on a subset of other vertices. |
| Subset dependency | A vertex can depend on any of a subset of vertices having been satisfied. |
| Ignore if failed | A vertex A can depend on another vertex B being measured and it is acceptable if B was marked as failed. |
| Unchanged | A vertex can depend on the value of another vertex being unchanged or changed less than a threshold value. If the other vertex value has changed more then a threshold value, the vertex needs to be measured again. |
| Ignore if changed | A vertex can depend on the value of another vertex being measured once and not caring if the value changes. |
| Untouched | A vertex can depend on the time (not the value) of another vertex being unchanged. |

A vertex may depend on zero vertices, in which case no edge connects the vertex to another vertex in the graph and the measurement represented by the vertex does not depend on any other measurement. An example of this type of dependency is a vertex representing measuring or determining whether a readout component device is available (or non-broken). In many cases, vertices with zero dependencies can be measured in parallel.

A lazy dependency is defined as a vertex depending on a subset of other vertices. This subset may be chosen randomly or selected based on other criteria. For example, before parameter A can be measured, an average of parameter B from 20 other devices needs to be measured, but it is not critical which other 20 devices are measured. In a quantum processor with a plurality of qubits, an example of lazy dependency is measuring or otherwise quantifying a parameter of only a few qubits. A lazy dependency may be used for providing a representation of different parts of the quantum processor (e.g., center versus edges) so that the average measured on a subset of vertices is not representative of a local region in the processor.

A subset dependency can be defined as a vertex depending on any a subset of vertices having been successfully measured. For example, parameter A requires any of parameters B, C or D to have been measured. For example, to be able to measure the flux period of a qubit, the readout system (i.e., the circuitry that brings signals from the quantum processor chip up to room temperature electronics) needs to be working and calibrated on the quantum processor. Depending on the specific hardware implementation, a readout circuit can be implemented as Non Destructive Read Out (NDRO), Frequency Multiplexed Resonator Readout or DC SQUIDs. Details of the above-mentioned readout systems can be found in International Patent Publication No. WO2012064974 and International Patent Publication No. WO2016183213A1. For a given processor, the classical computer executing the calibration procedure only needs to enforce that one of the readout systems is calibrated, namely the readout structure that exists on the quantum processor.

An 'Ignore if failed' dependency is defined as being where a vertex A depends on another vertex B being measured, but a failure to successfully measure B will not prevent classical computer 102 from proceeding to measure A. For example, the vertex representing crosstalk between two qubits may be measured or quantified before measuring or quantifying the flux period of the qubit; however, failing to measure crosstalk, for example because crosstalk may be too small to be accurately quantified, would not prevent the flux period of the qubit from being measured. However, an error in the measurement of the crosstalk is not an 'Ignore if failed' dependency and will not be ignored.

An unchanged dependency can be defined as a vertex A depending on the value of a vertex B being unchanged. For example, measuring or otherwise quantifying the NDRO maximum power depends on the measured or otherwise determined NDRO frequency remaining unchanged. Therefore, if the value of vertex B changes, vertex A needs to be measured or quantified again. In at least one implementation, the value of vertex B may change up to a threshold value. If the value if vertex B changes more than the threshold value, vertex A needs to be measured or quantified again.

On the contrary, a dependency can be defined for a vertex A to depend on having measured or quantified vertex B once, but a change in the value of vertex B would not require vertex A to be measured or quantified again. For example, noise on a processor chip can be measured using more than one method and as long as it has been measured or quantified once, classical computer 102 does not need to restart the calibration procedure if another method of measuring or quantifying noise is later used, resulting in a slightly different noise value.

An untouched dependency is defined as a vertex depending on the time, not the value, of another vertex remaining unchanged. An example of this type of dependency is vertex B representing saving data to a file where the value of vertex B is the file name and the time is the time the file was written on. In this example, the value of vertex B (the file name) might be unchanged but the time change indicates some changes in the content of the file. If vertex A depends on untouched vertex B (e.g., the contents of the file), vertex A needs to be measured again.

The dependencies and descriptions in Table 2 are provided for examples only. A person skilled in the art will understand that above list is not comprehensive, more dependencies can be added, and some dependencies may not be used.

Classical computer 102 must also order the vertices so they can be measured or quantified. Dependencies need to be respected in the order of measurement or quantification, while at the same time the order of measurement or quantification should be determined to reduce the time needed to measure all the vertices. Several strategies can be used for ordering the vertices, i.e., traversing the DAG. Classical computer 102 may order as many of the same measurements or quantifications as possible to be performed in parallel. For example, classical computer 102 may perform the same measurements or quantifications on each of the same type of devices in the quantum processor simultaneously. If independent parameters A and B need to be measured for each device in a quantum processor, classical computer 102 will order measuring or quantifying parameter A on each device in parallel, rather than measuring or quantifying parameter A on a first device and parameter B on a second device in parallel. The measurements or quantifications that are ordered to be performed in parallel can be performed simultaneously or concurrently without affecting one another. In another implementation, classical computer 102 may traverse the DAG in a breadth-first, depth-first, best-first or other order.

While traversing the DAG the calibration procedure may run into errors. Errors can result, for example, from broken devices that cannot be measured or otherwise quantified or determined. Therefore, the calibration procedure should to be able to process errors as the errors are encountered. As a result, classical computer 102 may update the status of vertices to reflect the type of error encountered. Some example status updates due to errors are listed in Table 3.

TABLE 3

| Status due to Error | Description |
| --- | --- |
| Do not keep going | Stop the calibration procedure until the user deals with the errors. |
| Keep-going | Mark the vertex as errored. Do not allow any vertices that depend on this vertex to run until the error is resolved. Other measurements can continue. |
| Failure | This error is not resolvable, permanently mark the vertex as failed. |

Some errors (e.g., 'Keep-going' from Table 3) may be due to local effects, e.g., errors that cause only one parameter measurement on a specific device to fail and do not affect other devices. In this case, measurements in parallel branches may continue, but any vertices that depend on the vertex marked as having an error may not be measured or quantified. A notification may be sent to a user to resolve the error.

Other types of error (e.g., 'Do not keep going' from Table 3) may require human intervention to resolve the error before continuing with the calibration procedure. In this case the classical computer 102 stops or pauses the calibration procedure, including parallel measurements or quantifications, until the error is resolved. The classical computer 102 may store intermediate measurements or quantifications in memory for future use when the calibration procedure resumes.

Other errors (e.g., 'Failure' from Table 3) are not solvable, even with human intervention. In this case the classical computer 102 executing the calibration procedure marks the vertex as permanently failed and isolates other vertices that depend on the failed vertex.

Some types of measurements or quantifications may take longer than a threshold time to measure or quantify. In this case, the classical computer 102 executing the calibration procedure may interrupt the measurements or quantifications and mark the vertices as failed. Classical computer 102 may save any intermediate measurement or quantifications in a separate memory system for further use.

Additionally, the classical computer executing the calibration procedure should be able to update the DAG as needed, depending on the results of the measurements or quantifications. Some of the updates include adding vertices and/or edges, removing vertices and/or edges, and changing edges. The time and status of each vertex needs to be updated accordingly whenever the DAG is modified. If the DAG needs to be updated, the calibration procedure may be restarted after updating is completed.

The calibration procedure may advantageously be implemented with a user interface that provides an adequate level of abstraction for a user. This may allow users without expert knowledge of the hardware implementation of the quantum processor to define parameters and dependencies, write or specify measurements for each parameter, and request the traversal of the directed acyclic graph, for example, a traversal up to a certain node. The user interface should allow a user to provide input to the calibration procedure through the interface so that the calibration procedure can implement the user input to order the DAG vertices. In addition, the user interface may allow a user to inspect the calibration procedure and the status of the DAG, including while the calibration procedure is executing.

FIG. 2 is a schematic diagram of an example directed acyclic graph 200 representing parameters to be measured or quantified of devices in a quantum processor and dependencies between the parameters. Directed acyclic graph 200 may be part of larger directed acyclic graph (not shown in FIG. 2) representing a calibration procedure for a quantum processor. Directed acyclic graph 200 may be implemented by a hybrid computing system comprising a quantum processor and a classical processor, for example hybrid computing system 100 of FIG. 1. Classical computer 102 may represent the directed acyclic graph with one or more data structures, including adjacency matrices and lists of edges.

Directed acyclic graph 200 comprises six vertices 201a-201f (collectively, 201), defining six measurements in a calibration procedure. Each vertex 201 has associated a set of editable attributes 202a-202f (collectively, 202). A set of editable attributes 202 comprises, for example, a time attribute (e.g., the time any of the vertex attributes has been modified), a status attribute (e.g., the current state of the vertex) and at least one value attribute (e.g., a numerical value representing the value of the measurement). Editable attributes 202 are modified during the calibration procedure, for example the time attribute is updated when the vertex is measured, the status attribute is updated to reflect the status of the measurement (e.g., successfully measured, error, etc.), and the value attribute is updated with the result of the measurement or quantification.

Dependencies between vertices 201 are represented in directed acyclic graph 200 by a plurality of directed edges 203a-c, 203a-b, 203b-d, 203d-e and 203d-f (collectively, 203), where the absence of a directed edge indicates the lack of a dependency between two vertices and the direction of the arrow indicates the order of the dependency. In FIG. 2, a directed edge from A to B indicates that A depends on B. For example, vertex 201b has a directed edge 203b-d pointing to vertex 201d, indicating that vertex 201b depends on vertex 201d. A person skilled in the art will understand that the direction of the arrows is purely an example and in other implementations the meaning of the direction may be the opposite (e.g., a directed edge from A to B indicates that B depends on A). A vertex can also depend on more than one other vertex, for example, vertex 201a has a directed edge 203*a-d* towards vertex 201*d* and a directed edge 203*a-c* towards vertex 201*c*, and vertex 201*d* has a directed edge 203*d-e* towards vertex 201*e* and a directed edge 203*d-f* towards vertex 201*f*. Therefore, vertices 201*e* and 201*f* are to be measured before vertex 201*d*, and vertices 201*b* and 201*c* are to be measured before vertex 201*a*. While in FIG. 2, vertices 201*a* and 201*d* each depend on two other vertices, a person skilled in the art will understand that the number of dependencies in FIG. 2 are examples and vertices can have more than two dependencies. Directed edges 203 may represent any of the dependencies listed in Table 2.

The classical computer executing the calibration procedure orders the vertices of directed acyclic graph 200. The ordering ensures that as many measurements or quantifications as possible are performed in parallel, while at the same time ensuring that the dependencies are respected. For example, classical computer 102 may order the vertices shown in FIG. 2 in this order: 1) 201*e* and 201*f* are measured or quantified in parallel, 2) 201*d*, 3) 201*b* and 201*c* are measured or quantified in parallel, 4) 201*a*. A person skilled in the art will understand that the above ordering is an example and other orderings that respect the dependencies are also possible. Directed acyclic graph 200 is shown so that the order of the measurements or quantifications starts from the bottom of directed acyclic graph 200 with respect to the orientation of the page of FIG. 2; however, a person skilled in the art will understand that directed acyclic graph 200 can be visually represented in other ways.

FIG. 3 is a schematic diagram of a portion of an example directed acyclic graph 300 for calibrating the flux period of a qubit. Directed acyclic graph 300 is a portion of a larger directed acyclic graph (not shown in FIG. 3) that can be used as part of a calibration procedure for a quantum processor. Directed acyclic graph 300 may be implemented by a hybrid computing system comprising a quantum processor and a classical processor, for example hybrid computing system 100 of FIG. 1. Classical computer 102 may represent the directed acyclic graph with one or more data structures, including adjacency matrices and lists of edges.

Directed acyclic graph 300 comprises nine vertices 301*a*-301*j* (collectively, 301) defining nine measurements that may be part of a calibration procedure in a quantum processor. A person skilled in the art will understand that the vertices in directed acyclic graph 300 alone may not be adequate to fully describe calibrating a qubit's flux period, and other vertices, representing other measurements or quantifications, may be added. Each vertex has a plurality of editable attributes associated with it (not shown in FIG. 3 to reduce complexity) comprising a time, a status, and a value, as described above with reference to editable attributes 202 of FIG. 2.

Dependencies between vertices 301 are represented in directed acyclic graph 300 by directed edges 303*a*-303*l* (collectively, 303), where the absence of a directed edge indicates the lack of a dependency between two vertices and the direction of the arrow indicates the order of the dependency. In FIG. 3, a directed edge from A to B indicates that A depends on B. For example, vertex 301*h* has a directed edge 303*i* pointing to vertex 301*j*, indicating that vertex 301*h* depends on vertex 301*j*. A person skilled in the art will understand that the direction of the arrows is purely an example and in other implementations the meaning of the direction may be the opposite (e.g., a directed edge from A to B indicates that B depends on A). A vertex can also depend on more than one other vertex, for example vertex 301*a* has a directed edge 303*a* towards vertex 301*c*, a directed edge 303*b* towards vertex 301*b*, a directed edge 303*c* towards vertex 301*e*, a directed edge 303*d* towards vertex 301*i*, and a directed edge 303*e* towards vertex 310*d*. Therefore, vertices 301*b*, 301*c*, 301*d*, 301*e* and 301*i* are to be measured or quantified before vertex 301*a*. While in FIG. 3 vertex 301*a* depends on five other vertices, a person skilled in the art will understand that the number of dependencies in FIG. 3 is an example and vertices can have any other number of dependencies. Directed edges 303 may represent any of the dependencies listed in Table 2.

The calibration procedure orders the vertices of directed acyclic graph 300. The ordering ensures that as many measurements or quantifications as possible are performed in parallel, while at the same time ensuring that the dependencies are respected. For example, the calibration procedure may order the vertices in this order: 1) 301*j*, 301*i* and 301*d* are measured or quantified in parallel, 2) 301*h*, 301*b* and 301*e* are measured or quantified in parallel, 3) 301*g*, 4) 301*f*, 4) 301*c* and 5) 301*a*. A person skilled in the art will understand that the above ordering is an example and another ordering that respects the dependencies is also possible. Directed acyclic graph 300 is shown so that the order of the measurement or quantification starts from the bottom of directed acyclic graph 300 with respect to the orientation of the page of FIG. 3; however, a person skilled in the art will understand that directed acyclic graph 300 can be visually represented in another way.

Figure 4:
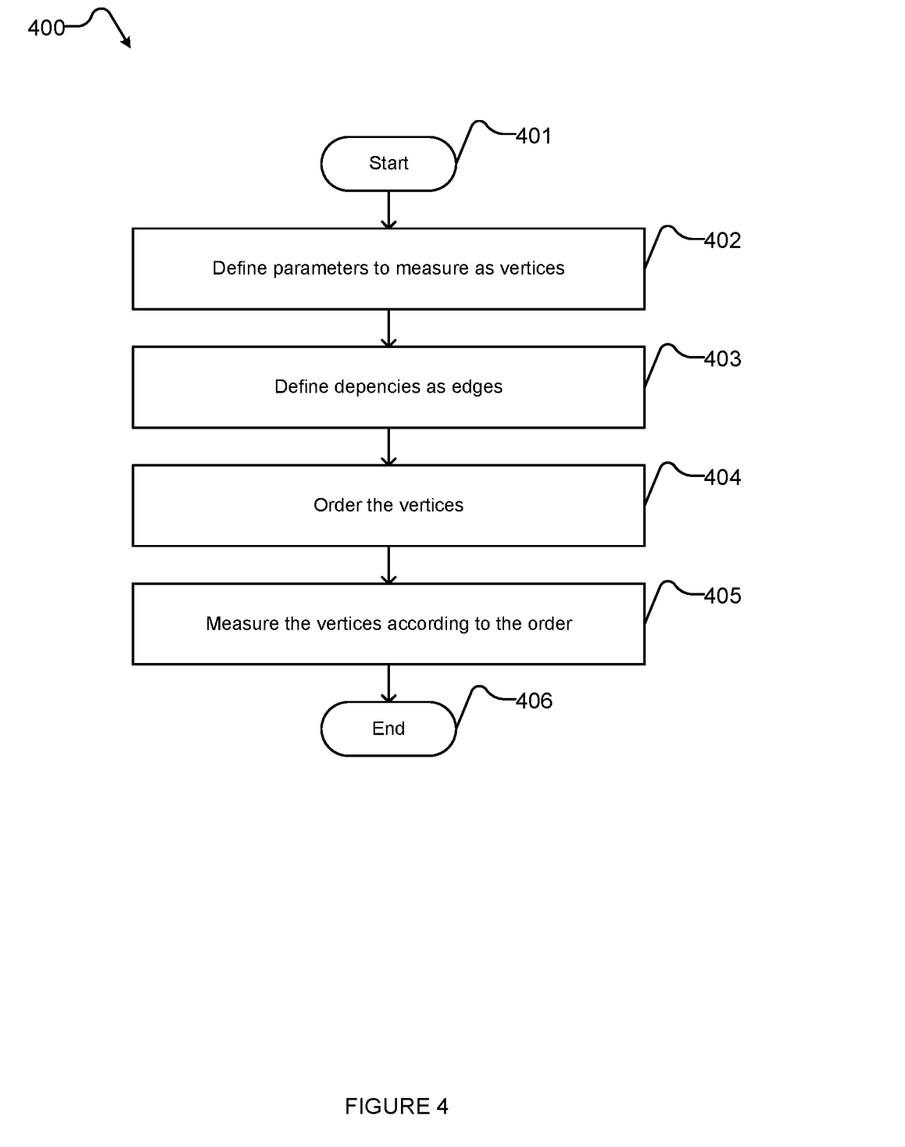
FIG. 4 is a flow chart showing an example method for calibrating parameters of devices in a quantum processor.

FIG. 4 is a flow chart showing an example method 400 for calibrating parameters of devices in a quantum processor. Method 400 may be implemented by a hybrid computing system comprising a classical and a quantum processor, for example hybrid computing system 100 of FIG. 1. Method 400 may be implemented when a quantum processor is first built and every time a quantum processor needs to be calibrated, for example periodically or during maintenance periods.

Method 400 comprises acts 401 to 406; however, a person skilled in the art will understand that the number of acts is an example, and, in some implementations, certain acts may be omitted, further acts may be added, and/or the order of the acts may be changed.

Method 400 starts at 401, for example in repose to a call from another routine.

At 402, hybrid computing system 100 defines parameters of the quantum processor as vertices in a DAG. The parameters represent measurements or quantifications needed for the operation of quantum processor 124. Parameters have a set of associated attributes, as described above with reference to directed acyclic graph 200 of FIG. 2.

At 403, hybrid computing system 100 defines dependencies between the vertices defined at 402 as directed edges in the DAG. A vertex can have between zero and a number n of directed edges, where n is an integer>0. The directed edges can represent different types of dependencies, as described above with reference to Table 2.

At 404, hybrid computing system 100 orders the vertices defined at 402. Hybrid computing system 100 may order the vertices using a topological sort, breadth-first sort, depth-first sort, best-fit sort, or any other sorting algorithm. The vertices are ordered to respect the dependencies between vertices and, at the same time, perform as many measurements in parallel as possible.

At 405, hybrid computing system 100 causes the measurements or quantifications to be performed according to the order defined at 404.

At 406, method 400 terminates, until it is, for example, invoked again.

Figure 5:
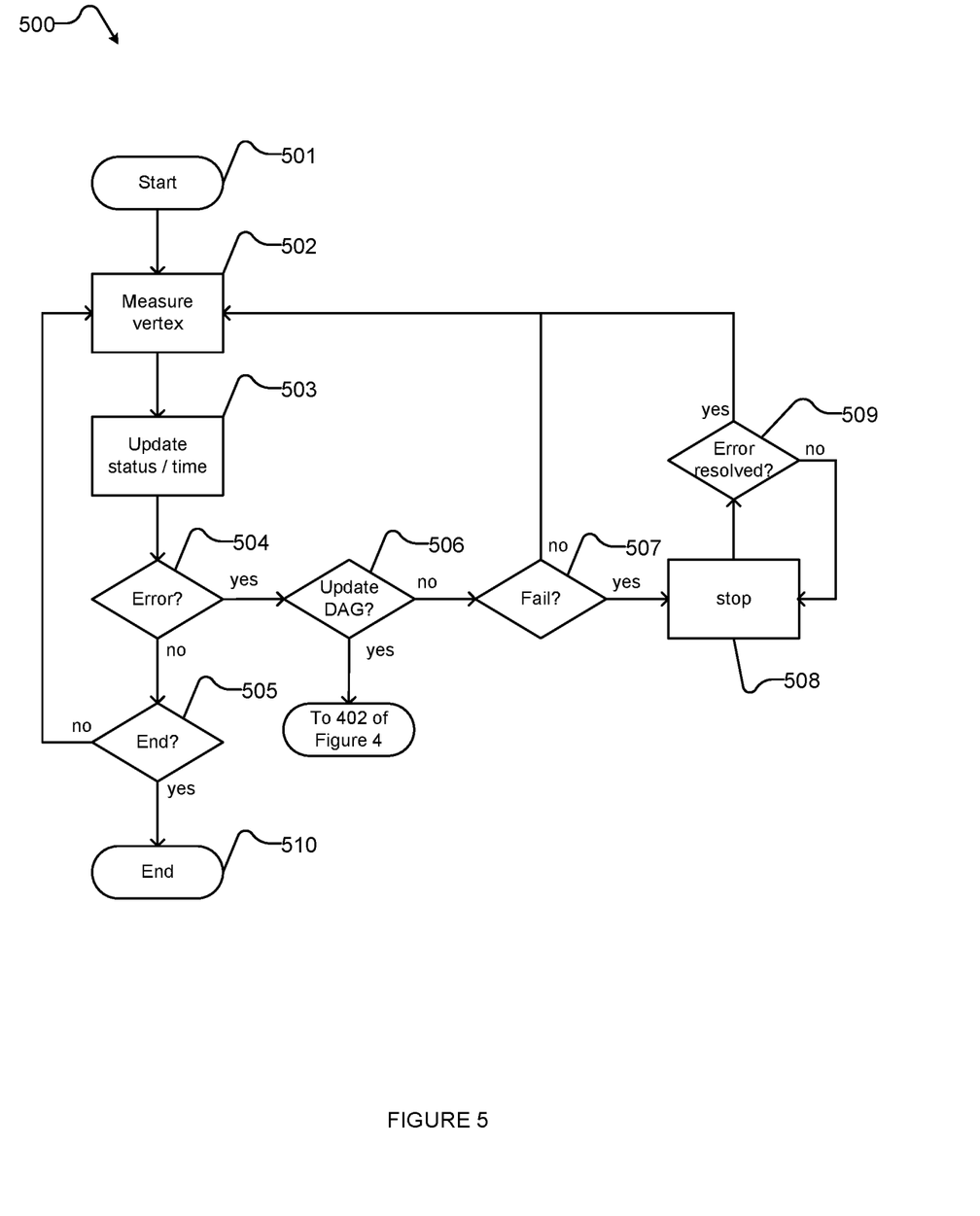
FIG. 5 is flow chart showing an example method for measuring vertices in a directed acyclic graph.

FIG. 5 is flow chart showing an example method 500 for measuring vertices in a directed acyclic graph. Method 500 may be used at act 405 of method 400, and may be implemented by a hybrid computing system, for example hybrid computing system 100.

Method 500 comprises acts 501 to 510; however, a person skilled in the art will understand that the number of acts is an example, and, in some implementations, certain acts may be omitted, further acts may be added, and/or the order of the acts may be changed.

Method 500 starts at 501, for example in response to a call from act 405 of method 400.

At 502, the calibration procedure measures or quantifies a vertex, according to the order determined at 404 of method 400.

At 503, the calibration procedure updates the status and/or time of the vertex measured or quantified at 502. The calibration procedure may add the measured or quantified value to the set of attributes associated with the vertex if the measurement or quantification is successful, otherwise the calibration procedure may mark the vertex as having an error.

At 504, the calibration procedure checks whether the vertex has been marked as having an error. If the vertex has not been marked as having an error, method 500 proceeds to 505, otherwise to 506.

At 505, the calibration procedure checks whether all vertices have been measured or quantified according to the order, thus completing the calibration procedure. If all vertices have been measured or quantified, control passes to 510, otherwise control passes to 502 and the calibration procedure measures or quantifies the next vertex according to the order.

At 506, the calibration procedure checks whether the error has been caused by the need to update the DAG or causes the need to update the DAG as a result of the measurement or quantification. For example, vertices and/or edges may need to be added or removed. If the DAG does not need to be updated, control passes to 507, otherwise to act 402 of method 400, where the DAG will be updated, a new ordering determined, and measurements or quantifications restarted. Depending on the type of update, the measurements or quantifications in progress may be saved, for example on a memory system, for future use.

At 507, the calibration procedure checks whether the error on the vertex is a type of error that causes the vertex to fail, for example a measurement or quantification taking longer than a threshold time. If the vertex has been marked with an error that causes failures of the vertex measurement or quantification, but not of the entire calibration procedure, then control passes to 502 and the calibration procedure measures or quantifies the next vertex according to the order, otherwise control passes to 508.

At 508, the calibration procedure stops. An alert may be sent to an expert user to verify the calibration stopped due to an erroneous measurement or quantification. In some cases, an expert user may manually solve the error.

At 509, the calibration procedure checks whether the error has been resolved and thus the calibration procedure can resume. A resolution of the error may be due to user intervention. If the error has been resolved, control passes to 502 and the calibration procedure measures the next vertex according to the order, otherwise control passes to 508 and the calibration procedure stops again.

At 510, method 500 terminates, until it is, for example, invoked again.

In some occurrences a quantum processor may experience a partial loss of calibration, e.g., an event that causes the need to recalibrate at least part of the quantum processor. An example of an event that may cause a partial loss of calibration is a temperature change in the isolated environment of the quantum processor. For example, if the temperature of superconducting material employed in the quantum processor rises above the critical temperature, the configuration of trapped flux on the devices in the quantum processor may change, thus changing the behavior of the devices.

When a quantum processor experiences a partial loss of calibration, it may be advantageous to employ a subset of a calibration procedure to only recalibrate parts of the quantum processor, rather than repeating a full calibration procedure. In particular, a partial loss of calibration is not expected to change the physical parameter of all devices (e.g., critical current of Josephson junctions, self-inductance of SQUID loops, etc.); thus, it may be possible to run only a subset of a calibration procedure.

A subset of a calibration procedure may employ at least two phases: a diagnostic phase and a short recalibration phase. The diagnostic phase identifies the devices with altered parameter values and the short recalibration phase performs a calibration of the devices identified. The short recalibration phase may measure or quantify a portion of the vertices of the calibration DAG according to the order defined at act 404 of method 400.

Examples of diagnostics that can be run on a quantum processor to determine which devices have altered parameter values due to partial loss of calibration are found in Table 4. The diagnostics and descriptions in Table 4 are provided for example only. A person skilled in the art will understand that the below list is not comprehensive, more diagnostics can be added, and some diagnostics may not be used.

TABLE 4

| Diagnostic | Description |
| --- | --- |
| Identify trapped flux in couplers | Coupled flux check at $J = +1, 0, -1, -2$ |
| Identify trapped flux in Ip compensators | Ip compensator diagnostic at $h = +1, 0, -1$ |
| Identify trapped flux in CCJJ structures | Persistent current check at balance points |
| Identify trapped flux in minor lobes | Run asymmetry/time-dependent offset check |
| Identify other residual changes | Run degeneracy point diagnostics |

Figure 6:
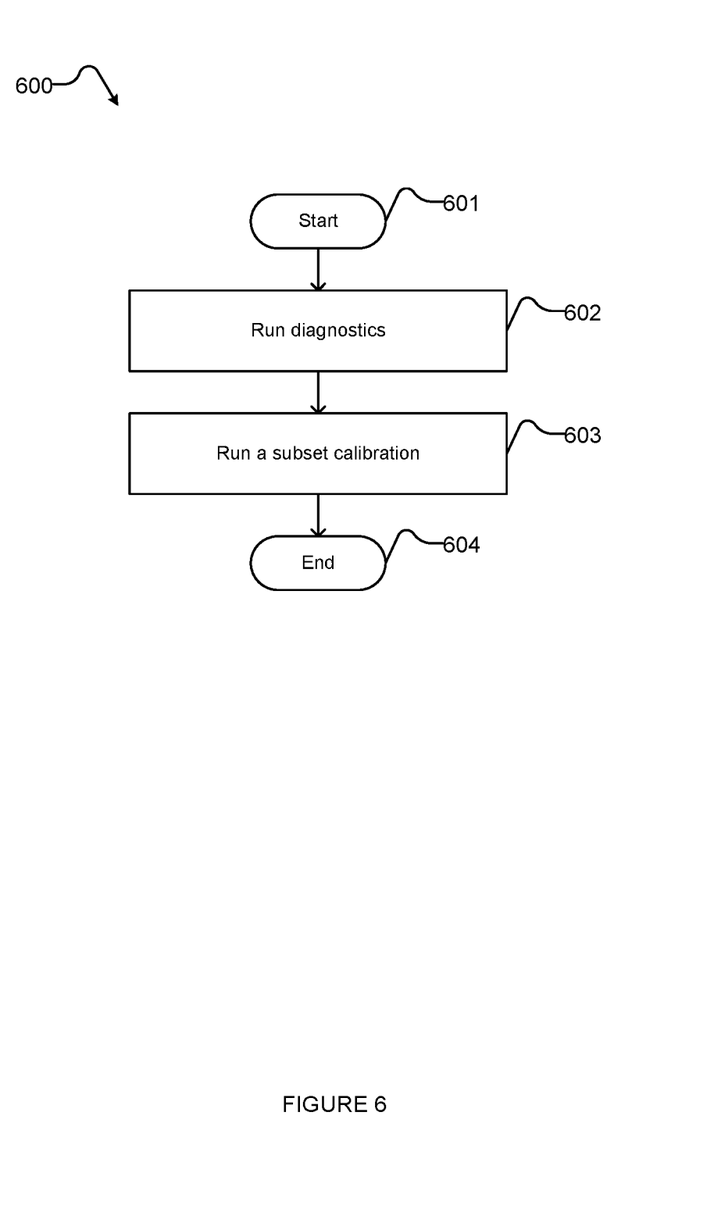
FIG. 6 is a flow chart showing an example method for implementing a subset of a calibration procedure.

FIG. 6 is a flow chart showing an example method 600 for implementing a subset of a calibration procedure. Method 600 may be implemented by a hybrid computing system comprising a classical and a quantum processor, for example hybrid computing system 100 of FIG. 1. Method 600 may be implemented every time a quantum processor needs to be recalibrated due to a partial loss of calibration.

Method 600 comprises acts 601 to 604; however, a person skilled in the art will understand that the number of acts is an example, and, in some implementations, certain acts may be omitted, further acts may be added, and/or the order of the acts may be changed.

Method 600 starts at 601, for example in response to a call from another routine.

At 602, hybrid computing system 100 runs a set of diagnostics on the devices of quantum computer 104 to determine which devices have altered parameter values due to partial loss of calibration. Examples of diagnostics that can run at 602 can be found in Table 4.

At 603, hybrid computing system 100 runs a subset calibration to recalibrate the devices that have been identified at 602 as having altered parameters. The subset calibration run at 603 may be shorter than a full calibration procedure. In at least one implementation the subset calibration may measure or quantify a portion of the vertices of the Directed Acyclic Graph according to the order defined at act 404 of method 400.

At 604, method 600 terminates, until it is, for example, invoked again.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for example purposes only and may change in alternative examples. Some of the example acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the example methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to: U.S. Patent Application 62/842,933; U.S. Pat. No. 7,533,068; International Patent Publication No. WO2012064974; and International Patent Publication No. WO2016183213A1.

These and other changes can be made to the implementations in light of the above-detailed description. In general, in the following claims, the terms used should not be construed to limit the claims to the specific implementations disclosed in the specification and the claims but should be construed to include all possible implementations along with the full scope of equivalents to which such claims are entitled. Accordingly, the claims are not limited by the disclosure.

The invention claimed is:

1. A method of calibrating a quantum processor by a hybrid processor, the hybrid processor comprising the quantum processor and a classical processor, the quantum processor having a plurality of devices, each of the plurality of devices having at least one respective parameter such that the quantum processor has a set of parameters comprising the at least one respective parameter of each of the plurality of devices, at least one of the parameters in the set of parameters having a dependence from another one of the parameters in the set of parameters, the method comprising:
    mapping the set of parameters as a plurality of vertices in a graph via the classical processor, each vertex in the plurality of vertices having at least one editable attribute;
    mapping each of the dependencies between parameters in the set of parameters as directed edges in the graph via the classical processor;
    ordering the plurality of vertices of the graph via the classical processor;
    measuring a value associated with each parameter in the set of parameters according to the order of the vertices of the graph via the classical processor; and
    updating the at least one editable attribute for each vertex with the measured value associated with each parameter.

2. The method of claim 1 wherein ordering the plurality of vertices of the graph includes ordering the plurality of vertices of the graph using one of: a topological sort, a breadth-first sort, a depth-first sort, and a best-first sort.

3. The method of claim 1 wherein mapping the set of parameters as a plurality of vertices in a graph includes mapping a vertex for each parameter whose measurement value is used to operate the quantum processor.

4. The method of claim 3 wherein mapping a vertex for each parameter includes mapping a vertex having editable attributes comprising a time, a status, and at least one value.

5. The method of claim 4 wherein mapping a vertex having editable attributes comprising a time, a status, and at least one value includes mapping a vertex having a time comprising the time the vertex was given a status.

6. The method of claim 4 further comprising updating the graph by at least one of: changing edges, adding edges, removing edges, adding vertices, removing vertices, updating vertices.

7. The method of claim 6 wherein updating the graph comprises updating the graph by updating vertices, and updating vertices includes updating the time, the status, and the at least one value.

8. The method of claim 6 wherein updating the graph includes updating the graph in response to an error.

9. The method of claim 6 wherein measuring a value associated with each parameter in the set of parameters further comprises interrupting measuring a selected parameter after a threshold time.

10. The method of claim 9 wherein interrupting the measuring a parameter after a threshold time includes saving any intermediate measurement of the parameter in a memory system.

11. The method of claim 1 wherein mapping each of the dependencies between parameters in the set of parameters as directed edges in the graph comprises mapping dependencies including at least one of: a vertex dependent on more than one other vertex, a vertex dependent on a subset of other vertices, a vertex dependent on the value of another vertex being unchanged, a vertex dependent on having measured the value of another vertex, and a vertex dependent on the time of another vertex being unchanged.

12. The method of claim 1 further comprising running a set of diagnostics on the plurality of devices via the classical processor; and
 in response to at least one respective device parameter having a parameter value different from a previously measured parameter value, measuring the at least one respective device parameter according to the order of the vertices of the graph via the classical processor.

13. The method of claim 12 wherein running a set of diagnostics on the plurality of devices includes running a set of diagnostics comprising one or more of: identifying trapped flux in couplers, identifying trapped flux in persistent current (Ip) compensators, identifying trapped flux in compound-compound Josephson junction (CCJJ) structures, identifying trapped flux in minor lobes, and identifying residual changes.

14. A hybrid computational system, the hybrid computational system comprising a quantum processor and a classical processor, the quantum processor comprising a plurality of devices, each of the plurality of devices having at least one respective parameter such that the quantum processor has a set of parameters comprising the at least one respective parameter of each of the plurality of devices, at least one of the parameters in the set of parameters having a dependence from another one of the parameters in the set of parameters, the classical processor operable to calibrate the quantum processor by:
 map the set of parameters as a plurality of vertices in a graph, each vertex in the plurality of vertices having at least one editable attribute;
 map each of the dependencies between parameters in the set of parameters as directed edges in the graph;
 order the plurality of vertices of the graph;
 measure a value associated with each parameter in the set of parameters according to the order; and
 update the at least one editable attribute for each vertex with the measured value associated with each parameter.

15. The hybrid computational system of claim 14 wherein the classical processor is operable to order the plurality of vertices of the graph by one of: a topological sort, a breadth-first sort, a depth-first sort, and a best-first sort.

16. The hybrid computational system of claim 14 wherein the classical processor is operable to map a vertex for each parameter needed to operate the quantum processor.

17. The hybrid computational system of claim 14 wherein each vertex has editable attributes comprising a time, a status, and at least one value.

18. The hybrid computational system of claim 17 wherein the time comprises the time a status was given to the vertex.

19. The hybrid computation system of claim 15 wherein the classical processor is further operable to update edges, remove edges, add edges, add vertices, remove vertices, and update vertices.

20. The hybrid computational system of claim 17 wherein the classical processor is operable to update the status, the time, and the at least one value of each vertex.

21. The hybrid computational system of claim 17 wherein the classical processor is operable update the graph in response to an error.

22. The hybrid computational system of claim 17 wherein the classical processor is operable to interrupt the measurement of a parameter after a threshold time.

23. The hybrid computational system of claim 22 wherein the classical processor is operable to store any intermediate measurement of the parameter in a classical processor memory system.

24. The hybrid computational system of claim 14 wherein the dependence between parameters in the set of parameters is defined as one of: a vertex dependent on more than one other vertex, a vertex dependent on a subset of other vertices, a vertex dependent on the value of another vertex being unchanged, a vertex dependent on having measured the value of another vertex, and a vertex dependent on the time of another vertex being unchanged.

25. A method of calibrating a quantum processor by a hybrid processor, the hybrid processor comprising the quantum processor and a classical processor, the quantum processor having a plurality of devices, each of the plurality of devices having at least one respective parameter such that the quantum processor has a set of parameters comprising the at least one respective parameter of each of the plurality of devices, at least one of the parameters in the set of parameters having a dependence from another one of the parameters in the set of parameters, the method comprising:
 mapping the set of parameters as a plurality of vertices in a graph via the classical processor;
 mapping each of the dependencies between parameters in the set of parameters as directed edges in the graph via the classical processor;
 ordering the vertices of the graph via the classical processor;
 measuring each parameter in the set of parameters according to the order of the vertices of the graph via the classical processor;
 running a set of diagnostics on the plurality of devices via the classical processor; and
 in response to at least one respective device parameter having a parameter value different from a previously measured parameter value, measuring the at least one respective device parameter according to the order of the vertices of the graph via the classical processor.

26. The method of claim 25 wherein running a set of diagnostics on the plurality of devices includes running a set of diagnostics comprising one or more of: identifying trapped flux in couplers, identifying trapped flux in persistent current (Ip) compensators, identifying trapped flux in compound-compound Josephson junction (CCJJ) structures, identifying trapped flux in minor lobes, and identifying residual changes.

* * * * *